_United States Patent_ [19]

Wernberg et al.

[11] Patent Number: 5,266,355
[45] Date of Patent: Nov. 30, 1993

[54] CHEMICAL VAPOR DEPOSITION OF METAL OXIDE FILMS

[75] Inventors: Alex A. Wernberg; Henry J. Gysling, both of Rochester, N.Y.

[73] Assignee: Eastman Kodak Company, Rochester, N.Y.

[21] Appl. No.: 970,629

[22] Filed: Nov. 3, 1992

Related U.S. Application Data

[63] Continuation-in-part of Ser. No. 900,135, Jun. 18, 1992.

[51] Int. Cl.$^5$ ............................................. C23C 16/00
[52] U.S. Cl. ............................ 427/248.1; 427/126.3; 427/109
[58] Field of Search .................. 427/126.3, 255, 255.1, 427/255.2, 255.3, 109, 110, 248.1

[56] References Cited

U.S. PATENT DOCUMENTS

| | | | |
|---|---|---|---|
| 3,911,176 | 10/1975 | Curtis et al. | 427/248 |
| 4,963,390 | 10/1990 | Lipeles et al. | 427/110 |
| 4,993,361 | 2/1991 | Unvala | 118/723 |
| 5,051,280 | 9/1991 | Hung | 427/226 |

OTHER PUBLICATIONS

"Preparation of Crystalline LiNbO3 Films With Preferred Orientation oby Hydrolysis of Metal Alkoxides", Advanced Ceramic Materials, vol. 3, No. 5, 1988, p. 503 et seq.
B. Curtis and H. Brunner, "The Growth of Thin Films of Lithium Niobate by Chemical Vapor Deposition", Mat. Res. Bull., vol. 10, pp. 515-520, 1975.
"Metal Alkoxides as Precursors for Electronic and Ceramic Materials", Bradley, Chem. Rev., vol. 89, pp. 1317-1322, 1989.

_Primary Examiner_—Shrive Beck
_Assistant Examiner_—David M. Maiorana
_Attorney, Agent, or Firm_—J. Jeffrey Hawley

[57] ABSTRACT

Thin, uniform films of complex metal oxides are deposited by chemical vapor deposition onto a substrate by vaporizing a single source precursor containing metal M' ions and metal M" ions, where metal M' is Li, Na, K, Ba, Mg, Ca, Sr, or Pb, and metal M" is V, Nb, Ta, or Ti, and contacting the vapor with the substrate at a temperature sufficiently high to decompose the precursor and form an M'M" metal oxide.

3 Claims, 1 Drawing Sheet

CHEMICAL VAPOR DEPOSITION OF METAL OXIDE FILMS

RELATED APPLICATIONS

This application is a continuation-in-part of U.S. application Ser. No. 07/900,135, filed Jun. 18, 1992, titled CHEMICAL VAPOR DEPOSITION OF METAL OXIDE FILMS. Also filed by the applicants herein were copending and commonly assigned U.S. Patent application Ser. No. 07/900,283, filed Jun. 18, 1992, titled CHEMICAL VAPOR DEPOSITION OF METAL OXIDE FILMS FROM REACTION PRODUCT PRECURSORS; and Wernberg et al., U.S. Ser. No. 07/970,566, filed concurrently herewith and commonly assigned, titled CHEMICAL VAPOR DEPOSITION OF NIOBIUM AND TANTALUM METAL OXIDE FILMS.

FIELD OF THE INVENTION

This invention relates to a method for depositing metal oxide films on a substrate. More particularly, this invention relates to the chemical vapor deposition of complex metal oxide films, such as lithium niobate.

BACKGROUND

Lithium niobate, $LiNbO_3$, is well known for its electrooptic, ferroelectric and piezoelectric properties, and is widely used in integrated and guided-wave optics applications, such as couplers, switches, modulators, deflectors and rf spectrum analyzers.

Although polycrystalline and single crystal $LiNbO_3$ have been prepared by a variety of standard solid state synthetic methods, relatively little work has been reported dealing with the fabrication of thin films of this material. Magnetron and of sputtering and molecular beam epitaxy have been used to fabricate thin films of $LiNbO_3$. These techniques, however, require complicated and expensive high vacuum equipment. It is also difficult, using these processes, to maintain film uniformity over large areas. Further disadvantages are the low growth rates associated with these techniques as well as their difficulty in providing conformal coverage. Conformal coverage is the degree to which the deposition follows the contour of the substrate surface. Line of sight techniques such as sputtering typically exhibit poor conformal coverage.

In "Preparation of Crystalline $LiNbO_3$ Films with Preferred Orientation by Hydrolysis of Metal Alkoxides," Advanced Ceramic Materials, Vol. 3, No. 5, 1988, a process is disclosed for preparing $LiNbO_3$ thin films using single source reagents by a sol gel process utilizing hydrolysed metal alkoxides, such as, for example, an ethanol solution of lithium ethoxide and niobium ethoxide. It is difficult to obtain epitaxial films using sol-gel deposition techniques as it is not possible to control the crystallization rate using this process.

U.S. Pat. No. 5,051,280 discloses a method for producing alkali metal niobates and tantalates which involves pyrolyzing the stoichiometric salt of an alkali metal and a niobium or tantalum complex of a bidentate or tridentate ligand. For example, the salt may be dissolved and then coated on a substrate, after which the coating is pyrolyzed at 400° C. for 10 minutes. It is difficult to obtain high quality films having monocrystallinity using such a organometallic decomposition method, due to the lack of control in the crystallization rate as well as the relatively large amount of organic material that is evolved during the processing of the coated precursor layer.

Chemical vapor deposition (CVD) is a technique capable of depositing films at high growth rates. To date there has been little work done on depositing complex metal oxide films such as $LiNbO_3$ by CVD.

One method for forming $LiNbO_3$ films by chemical vapor deposition is disclosed in Curtis and Brunner U.S. Pat. No. 3,911,176, and in "The Growth of Thin Films of Lithium Niobate by Chemical Vapor Deposition," by B. Curtis and H. Brunner, Mat. Res. Bull. Vol. 10, pp. 515–520, 1975. Both of these references disclose vaporizing separate lithium and niobium compounds and bringing the resultant vapors in contact with a heated substrate in an oxidizing atmosphere. Preferred materials for producing the vapor precursor include lithium chelates of beta-diketonates and niobium alkoxides. One disadvantage to a process such as this, which utilizes separate sources for each metal precursor, is that it is difficult to make each precursor volatilize at the same rate. Consequently, because there is usually more of one metal than the other in the precursor vapor, it is difficult to achieve the desired 1:1 stoichiometry in the resultant $LiNbO_3$ film. In addition, when dual source precursors are involved, one of the metals may deposit preferentially, leading to an undesirable film composition. Further, the films deposited using the Curtis CVD method are initially black, and therefore not useful in many electro-optic applications which require high light transmittance, until they have first been annealed.

"Metal Alkoxides as Precursors for Electronic and Ceramic Materials", by Bradley, Chem. Rev., Volume 89, pp. 1317–1322 (1989), mentions that barium titanate, $BaTiO_3$, can be deposited on a quartz substrate using the heterometal alkoxide $BaTi(OPr^i)_6$ in 2-propanol solution. However, there is no indication of the method utilized to achieve this deposit.

Thus, there continues to be a need for a chemical vapor deposition process that will produce monocrystalline complex metal oxide films which have an epitaxial relationship to the substrate and, preferably, do not require subsequent annealing to produce optically transparent films. The same need holds true for other common complex metal oxides which exhibit useful electrooptic, ferroelectric and piezoelectric properties, in particular the vanadates, niobates, tantalates, zirconates, hafnates and titanates of alkali metals, alkaline earth metals, and lead.

BRIEF SUMMARY OF INVENTION

In accordance with the present invention, a method for depositing a complex metal oxide film on a substrate comprises:

vaporizing a single source precursor having an M' metal ion and a M" metal ion therein, wherein one of either M' or M" is Li, Na, K, Mg, Ca, Sr, Ba, or Pb, and the other of either M' or M" is V, Nb, Ta, Ti, Zr or Hf; and contacting said substrate with the vapor of said single source precursor at a temperature sufficient to deposit said complex metal oxide on said substrate.

After vaporizing the single source precursor, the vapor of the precursor is quickly transported to the substrate using a carrier gas so that disproprotionation of the precursor is avoided. Under most conditions the carrier gas flow rate preferably should be high enough to transport the vapor from the nebulization chamber to the substrate in less than 10 seconds, more preferably less than 5 seconds, and most preferably less than 3 seconds after vaporization occurs.

Preferably, the precursor vapor is contacted with the substrate at a temperature sufficient to form a crystalline oxide film. Preferably, the film is monocrystalline, stoichiometric, and epitaxial with the substrate.

DETAILED DESCRIPTION OF THE INVENTION

Figure 1:
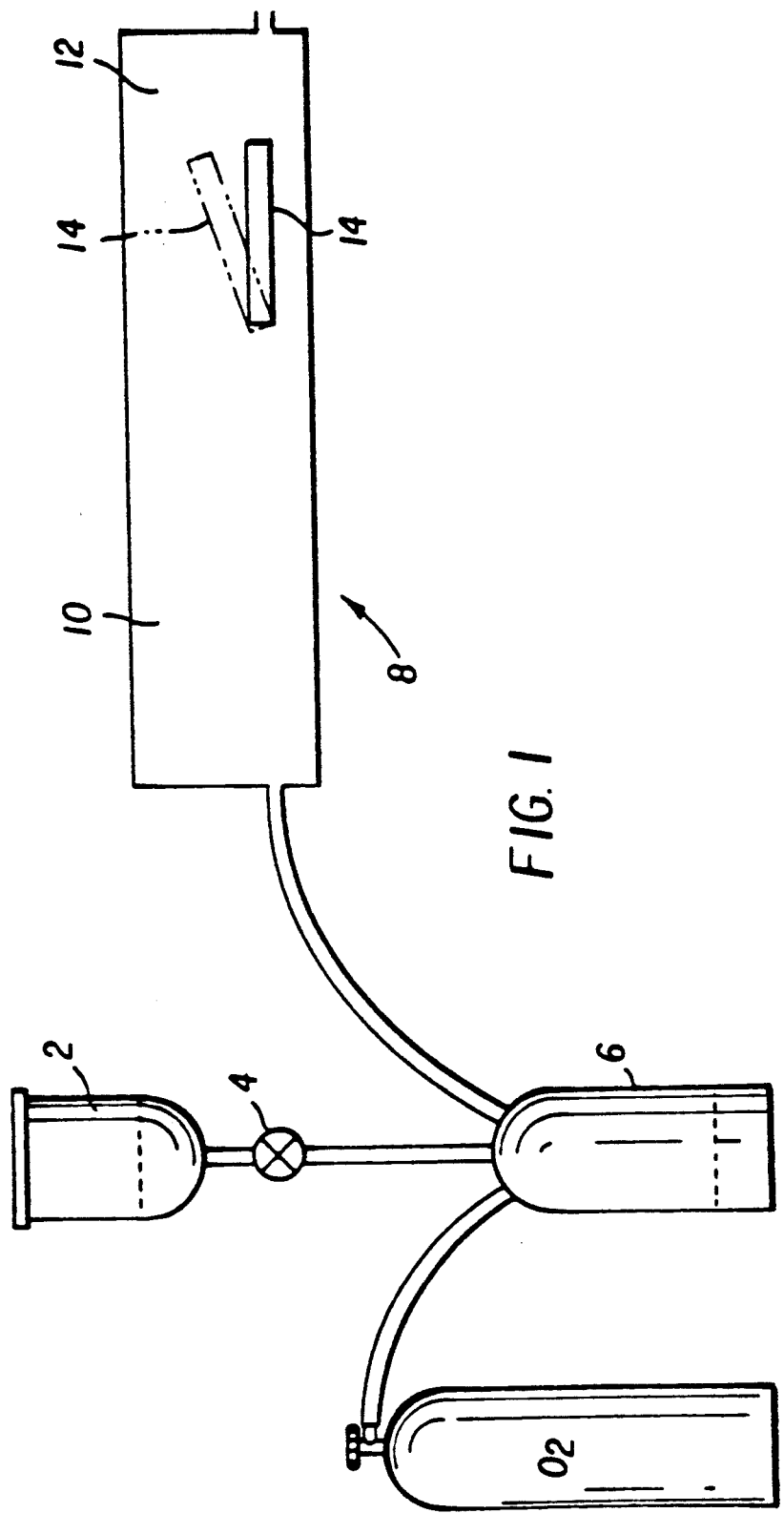
FIG. 1 shows a sectional view of an apparatus suitable for carrying out the chemical vapor deposition process in accordance with the invention.

In accordance with the present invention, complex metal oxide (i.e., oxides having more than one metal constituent) coatings are deposited by CVD by providing a single source precursor having an M' metal ion and an M" metal ion therein, wherein one of either M' or M" is Li, Na, K, Mg, Ca, Sr, Ba or Pb, and the other of either M' or M" is V, Nb, Ta, Ti, Zr, or Hf. The single source precursor is then vaporized and contacted with a substrate at a temperature sufficient to decompose the precursor and deposit a complex metal oxide on the substrate. In a preferred embodiment, this method is used to form oxides of the form M'M"$O_3$. Examples of such oxides are $LiNbO_3$, $LiTaO_3$, $BaTiO_3$, $KNbO_3$, $KTaO_3$, $PbTiO_3$ and $SrTiO_3$.

In the CVD art, the materials used to form the vapor normally are referred to as precursors. By single source precursor, as used herein and in the appended claims, it is meant that the source of the vapor used to deposit the CVD film is a single source. Thus, the single source precursor in accordance with the present invention could be, for example, a single liquid solution containing one or more organometallic compounds dissolved therein. Alternatively, a single organometallic compound may be directly vaporized by appropriate heating, so long as the compound does not decompose prior to vaporization. Conversely, most CVD deposition technologies, such as Curtis in U.S. Pat. No. 3,911,176, utilize vapor derived from more than one source.

The single source precursor may be provided by dissolving a metal M' organometallic compound and a metal M" organometallic compound in a solvent to form a single source precursor solution. Alternatively, a single organometallic compound having an M' and M" ion therein may be used as the single source precursor. This single organometallic compound may be vaporized as is, or, prior Lo vaporization, the single organometallic compound having both an M' and M" metal ion therein may be dissolved in a solution after which the solution is vaporized. By providing the metal ions in a stoichiometric ratio, and carefully controlling the vapor deposition process, substantially uniform and stoichiometric films are deposited. Alternatively, in some applications it is possible to directly vaporize such a single organometallic compound (without first dissolving into solution) to form the desired vapor.

In cases where the single source precursor is a liquid, the single source precursor is preferably nebulized or atomized prior to vaporization. The precursor mist resulting from the nebulization is then transported from the CVD reactor or a similar device capable of vaporizing the mist. After vaporization, the vapor stream is preferably transported quickly to the substrate before any disproportionation or other decomposition of the precursor occurs.

A preferred embodiment of the method, used to form lithium niobate films, comprises dissolving a lithium organometallic compound, such as lithium t-butoxide, and a niobium organometallic compound, such as niobium ethoxide, in a solution, forming an aerosol or mist of the solution, vaporizing the aerosol, and passing the resulting vapors over a substrate heated to an appropriate temperature to decompose the precursor and form the desired oxide film. By thus mixing the metal ions in the single source precursor solution in substantially the same stoichiometric ratio desired in the resultant film, at least a portion of the resultant film is of substantially uniform stoichiometry. Consequently, for a $LiNbO_3$ film, for example, a portion of the resultant film is essentially stoichiometric $LiNbO_3$, which is epitaxial with the substrate, of a single crystalline phase, transparent, and of generally higher quality than films produced using the techniques previously disclosed in the prior art. Preferably, the solution containing the Li and Nb containing compounds is prepared so that substantially a 1:1 molar ratio of Li metal to Nb metal results. Consequently, the vapor will have substantially the same metal ratio as the precursor solution. By substantially a 1:1 molar ratio, as used herein in the specification and claims, it is meant that the metal ratio of the single source precursor solution is substantially, but not necessarily exactly, the same metal ratio as the desired film. Thus, for example, in the case of $LiNbO_3$ films, a suitable precursor solution of organometallic compounds consists of, for example, an atomic ratio of about 48Li:52Nb or, more preferably, 50Li:50Nb. However, as will be discussed below, such accuracy is not essential to forming stoichiometric $LiNbO_3$ films, and in some situations less stoichiometric solutions are sufficient for forming stoichiometric $LiNbO_3$ films.

It should also be noted that by "stoichiometric film", as used herein and in the claims, it is meant that the film has substantially the same metal ratio as the desired complex metal oxide. Thus, for example, a $LiNbO_3$ film having a uniform correct stoichiometry, as used herein and in the claims, has a substantially uniform and preferably a completely uniform composition of $LiNbO_3$, and does not, for example, contain substantial areas that are rich in Li or Nb metal content. However, in some embodiments of the present invention, due to relatively minor preferential decomposition and/or film formation of metal species, there may be portions of the resultant film which are not substantially stoichiometric. However, a portion of a resultant $LiNbO_3$ film, for example, which consists of 45-55 atomic percent Nb, is considered substantially stoichiometric, as used herein. Preferably, in the case of a $LiNbO_3$ film, the film is 100 percent $LiNbO_3$ (or 50 atomic percent Nb and 50 atomic percent Li) throughout the entire deposited area.

In an another preferred embodiment of the invention, an organometallic compound containing both the M' and M" in a 1:1 ratio, such as, for example, a lithium niobium alkoxide, is dissolved in an appropriate solution to form a single source precursor solution. Films formed using a single organometallic compound which have both metal constituents in the desired stoichiometric ratio normally have more uniform crystal structures, compositions and properties. For $LiNbO_3$ films formed by CVD, for example using lithium niobium alkoxides such as lithium niobium ethoxide, the entire resultant film is stoichiometric $LiNbO_3$, which is epitaxial with the substrate, of a single crystalline phase, transparent, and of generally higher quality than films produced using the techniques of the prior art.

For vaporization from a single source solution, the organometallic precursor compound or compounds must be sufficiently soluble in an appropriate organic solvent and/or sufficiently volatile to allow vapor transport of the precursor compound(s) to the heated substrate after evaporation of the carrier solvent. Although a wide variety of such compounds have potential utility, reagents containing metal-oxygen bonds are especially preferred since they incorporate the basic framework of the desired solid state material and produce $LiNbO_3$ and other mixed oxide electrooptic ceramics at relatively low processing temperatures, with lower carbon contamination compared to other classes of precursor reagents (e.g., organometallics containing metal-carbon bonds). In addition, such precursors minimize or, ideally, eliminate the need for inclusion of oxygen in the processing atmosphere and therefore offer important safety advantages by reducing explosion hazards associated with mixtures of organic solvents and molecular oxygen.

Preferred compounds include, for example, metal ethoxides, methoxides, n-butoxides, t-butoxides, n-propoxides and isopropoxides. Thus, by dissolving a metal M′ butoxide and a metal M″ ethoxide in an appropriate solvent, a solution is formed which contains the M′ and M″ metals desired in the resultant oxide film. The single source precursor solution is then atomized and/or vaporized. In some applications, it may be desirable to form the precursor solution by dissolving stoichiometric ratios of the solid components which contain the metal constituents in a suitable solvent.

More preferably, both the metal M′ and M″ ions are provided by a single organometallic compound. Thus, by dissolving a metal M′M″ ethoxide, for example, in an appropriate solvent, a solution is formed which contains the M′ and M″ metals desired in the resultant oxide film in the exact stoichiometric ratio desired in the resultant film.

Preferably, the single source precursor solutions of the present invention are nebulized or atomized prior to vaporization, using conventional methods, such as, for example, an ultrasonic nebulizer. In the case where a solution is not utilized, i.e., the single source organometallic compound is to be directly vaporized, vaporization may occur by heating the compound directly to achieve volatilization. Suitable single compounds which can be used in this manner include any compound which can be sufficiently volatilized without encountering substantial disproportionation of the compound.

The vapor of the single source precursor is transported to the substrate using any transport method conventionally utilized in CVD operations, such as, for example, with $O_2$ or an inert carrier gas. To form an oxide coating, the single source vapor precursor may be contacted with the substrate in an oxidizing atmosphere and at a temperature sufficient to decompose the precursor, leaving a film of the form M′M″ on the substrate. Alternatively, if there is enough oxygen present in the single source vapor precursor, an oxidizing atmosphere may not be necessary, and the reaction may take place in an inert atmosphere or under a vacuum.

One potential problem with chemical vapor deposition is the tendency of some metal oxides to deposit preferentially relative to the other metal oxides. In the case of the method for forming $LiNbO_3$ from a single source precursor solution derived from two separate organometallic compounds, for example, when a horizontal CVD reactor (and substrate orientation) are employed, it is difficult to achieve a substantially uniform composition across the entire surface of the substrate. In such cases, due to preferential lithium oxide deposition, the leading edge of the horizontal substrate is typically lithium rich, while the trailing edge of the substrate is typically lithium deficient. However, between these two edges, a region of film is present which is substantially uniform $LiNbO_3$. The composition of these substantially uniform regions are generally sufficiently stoichiometric to be useful as an electrooptic, ferroelectric, or piezoelectric material.

Furthermore, by carefully controlling the deposition parameters, the size of the stoichiometric region can be increased. For example, by orienting the substrate vertically, rather than horizontally, and impinging the gas perpendicular to the substrate surface, the preferential deposition may be lessened, since the vapor will impinge upon the entire length of the substrate at relatively the same time.

Further improvements on the consistency of film deposition may be achieved by utilizing a low pressure reactor. In the case where two separate Li and Nb containing compounds are utilized in solution, by lowering the pressure inside the reactor, preferential deposition of the precursor metal compounds can be minimized. Alternatively, such preferential decomposition can be minimized by increasing the flow rate of precursor vapor into the reactant chamber.

Finally, if one metal species reacts preferentially, the concentration of this species in the oxide film can be reduced by reducing its concentration in the initial precursor solution accordingly.

More preferably, however, improvements in the consistency of film composition may be achieved by forming the single source precursor from a single organometallic compound containing both of the desired M′ and M″ metal constituents in the exact stoichiometric ratio desired in the film. $LiNbO_3$ films formed in this manner, using a single organometallic compound dissolved in a suitable solvent, have exhibited uniform composition and properties across the entire substrate. These films are stoichiometric and epitaxial with the substrate, of a single crystalline phase, and transparent. One preferred form of organometallic compound which contains both the M′ and M″ metal constituents is the form:

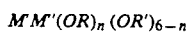

$M'M''(OR)_n (OR')_{6-n}$ where R and R′ each individually represents a substituted or unsubstituted alkyl or aryl, and n is from 0 to 6. Thus, by alkyl and aryl, as used herein and in the claims, it is meant both substituted and unsubstituted alkyls and aryls. Preferred examples of unsubstituted alkyl groups are ethyl, methyl, n-propyl, i-propyl, n-butyl, t-butyl and the like. Useful substituents include, for example, alkoxy, carboxy, halo groups such as fluoro and chloro, and amino groups such as $NH_2$, $NR_2$, and the like. Aryl groups can be phenyl and substituted phenyl groups such as perfluoro phenyl, anisyl, tolyl, mesityl, and the like. It should be noted, however, that the invention is not limited to the groups, substituents or compound forms listed above.

Although the present invention is particularly suited to forming oxides of the form $M'M''O_3$, complex metal oxides as used herein and in the claims means any metal oxide in which there are two or more metal ions. Particularly preferred complex metal oxides include those specifically listed hereinabove. It should be noted, however, that the above list of metals is given for example only, and is not meant to limit the invention.

The method can also be used to form oxides such as, for example, lead zirconate CA titanate (PZT). In such an application, three metals are incorporated into the single source precursor solution, the solution is then vaporized, etc., in accordance with the present invention to deposit the PZT film by CVD.

A preferred CVD apparatus suitable for use in the liquid single source solution embodiment of this invention is illustrated in FIG. 1, although other conventional CVD apparatus can also be utilized. Referring to FIG. 1, a storage reservoir 2 is provided for storing a single source precursor solution, which contains the particular organometallic compound or compounds, (containing M' and M" ions) dissolved in a suitable solvent. The single source precursor solution is then dispensed from storage reservoir 2 by appropriately adjusting a valve 4, whereupon the solution is transported, in this case via gravity, to an atomization or nebulization chamber 6.

Alternatively, the solution may be placed directly into the atomization or nebulization chamber 6. The chamber 6 consists of any conventional means for converting the liquid single source precursor solution to a mist, such as, for example, an ultrasonic nebulizer. The solution is atomized in nebulization chamber 6, forming a single-source precursor mist. This atomized mist is then transported, using a suitable carrier gas, to a horizontally oriented reactor 8, which has a low temperature zone 10 and a high temperature zone 12. The low temperature zone 10 is preferably held at a high enough temperature to immediately volatilize the single-source precursor mist, forming a vapor from the single source precursor. By first using a nebulization device to form a mist of the single source precursor prior to vaporization of the single source precursor, the single source precursor materials may be held at a relatively low temperature until just prior to vaporization. Further, by nebulizing the precursor, the surface area of the precursor exposed for vaporization is greatly increased, resulting in rapid vaporization of the precursor in the same ratio as the single source precursor solution itself. Consequently, preferential vaporization, such as would occur using a bubbler to form the vapor, is avoided, and a concentrated vapor stream is produced which may then be transported to the substrate. The nebulization typically results in the formation of droplets having a diameter of less than 10 microns, preferably 1 to 5 $\mu$m. The flow of carrier gas used to transport the atomized mist is preferably great enough to quickly transport the vaporized precursor to the substrate before any disproportionation or other decomposition of the organometallic precursor compound occurs. The time between which the precursor is vaporized and the hot substrate is contacted with the vapor is preferably less than 10 seconds, more preferably less than 5, and most preferably 3 or less seconds. In the examples described hereinbelow, a cylindrical horizontal reactor having a 41 mm inside diameter was used which had a distance from the opening of the reactor 8 to the substrate of about 40.6 cm (16 inches). For this reactor, a flow rate of carrier gas of about 1 to 10 SLM, more preferably about 4 to 6 SLM, and most preferably about 4.5 SLM, was sufficient to adequately transport vapor to the substrate. For a carrier gas flow rate of about 4.5 SLM, for example, the time between when the nebulized mist first entered reactor 8 and the time at when the resultant vaporized precursor contacted the substrate was about 1 second. However, even shorter transport time periods, such as, for example, one-half second or less, are easily conceivable.

Because a concentrated vapor stream is contacted with the substrate, films may be deposited more quickly and efficiently. For example, in the case of $LiNbO_3$ films deposited on sapphire using a solution of $LiNb(OC_2H_5)_6$, deposition rates of about 1 micrometer ($\mu$m) (10,000 angstroms) film thickness per hour may be easily achieved. The high temperature zone 12 is held at a temperature high enough to decompose the precursor, and allow the metal M' and metal M" ions to react and form a complex metal oxide film on the substrate 14 located therein. More preferably, the high temperature zone is held at a temperature high enough to immediately form a crystalline metal oxide film. In most instances, a temperature range of about 300° C. to 700° C. will be suitable for this purpose. Alternatively, a reactor having a single temperature zone could be utilized, in which case the single temperature zone would be held at a temperature high enough to both decompose the precursor and allow the metal M' and M" ions to react and form a complex metal oxide film on the substrate. Such a high temperature would necessarily immediately volatilize the single source precursor mist as it enters the reactor. More preferably, if a reactor having a single temperature zone is utilized, the temperature zone is held at a temperature high enough to immediately form a crystalline metal oxide film.

The substrate 14 may be oriented horizontally or, more preferably, is tilted toward the incoming precursor vapor, as illustrated in FIG. 1.

Substrates suitable for use in this process ideally are stable up to about 1000° C. Most common substrates used in electro-optic technology can be used including single crystal and polycrystalline substrates. Suitable substrates include, for example, silicon, germanium, Group III–V semiconductor substrates such as gallium arsenide, platinum foil, yttrium aluminum garnet, spinel, sapphire (single crystal alumina), lithium niobate, lithium tantalate, magnesium oxide and strontium titanate.

Using the method of the present invention, transparent $LiNbO_3$ films of useful thickness, i.e. 0.2 to 2 $\mu$m (2,000 to 20,000 angstroms) can be easily deposited on these substrates. In fact, as mentioned above, $LiNbO_3$ films approximately 0.4 $\mu$m (4000 angstroms) thick were deposited on sapphire in less than one half hour. These transparent, epitaxial films are useful as optical waveguides.

The reaction may be carried out in a wide variety of apparatus and under varying reaction conditions. A carrier gas, which may or may not include oxygen, may be used or the reaction may take place at reduced pressure. Reaction temperatures, pressures and times may be varied.

The invention is further illustrated by reference to the following specific examples.

EXAMPLE 1

Preparation of Lithium Niobate Films from the Separate Precursors Li(O—t—C$_4$H$_9$) and Nb(O—C$_2$H$_5$)$_5$ A toluene solution containing 0.01M each of Li(O—t—C$_4$H$_9$) and Nb (O—C$_2$H$_5$)$_5$ was prepared and the resulting solution was transferred to the ultrasonic nebulization chamber 6, as shown in FIG. 1, removed from the glove box and then connected to reactor 8. Chamber 6 and reactor 8 were then purged with a carrier gas consisting of a mixture of 6 percent oxygen in argon, and reactor 8 heated to the desired operating temperature. The low temperature zone 10 of reactor 8 was heated to 360° C. while the high temperature zone 10, which contained a ($\overline{1}102$) sapphire substrate 12, was heated to 506° C. On temperature equilibration of the reactor 8 and substrate 12, the solution was atomized in nebulization chamber 6 and transported into the reactor by the carrier gas flowing at 4.5 SLM. After deposition for thirty minutes, the atomization was discontinued and the reactor allowed to cool under the oxygen/argon flow. The substrate was diced into 1 cm sections and the resultant pieces analyzed for crystalline phases and elemental compositions. The thin film that formed on the sapphire substrate was not uniform. The film closest to the entrance of the reactor was found to contain oriented lithium niobate as the only detectable crystalline phase. However, the ratio of lithium to niobium in this section of film was 6:4 as determined by inductively coupled plasma optical absorption spectroscopy (ICP). The only phase detected in the film deposited in the second section of the substrate was a polycrystalline lithium niobate phase. ICP analysis indicated that the film in this portion was lithium deficient, the ratio of lithium to niobium being 3.5:6.5. Films formed farther along on the substrate contained decreasing ratios of lithium to niobium with no crystalline phases being detected by XRD. Films formed on the substrate farthest away from the entrance of the reactor contained niobium only. However, in between the Li-rich and Li-deficient portion was a portion of LiNbO$_3$ having a substantially uniform and correct stoichiometry. This portion would be useful as an electro-optic material. As explained above, this useful portion can be increased by varying certain deposition parameters, such as, for example, using a vertical reactor under a low pressure.

COMPARATIVE EXAMPLE 1

LiNb(OC$_2$H$_5$)$_6$ was prepared by adding lithium metal to an ethanol solution containing Nb(OC$_2$H$_5$)$_5$. After refluxing overnight, the mixture was concentrated under vacuum to give a white precipitate of the single-source precursor LiNb(OC$_2$H$_5$)$_6$. 0.6 g of the LiNb(OC$_2$H$_5$)$_6$ was mixed in 300 ml of toluene. Handling of the precursor compound and preparation of the mixture was done inside a glove box in an argon atmosphere. These constituents resulted in a milky suspension. This suspension was atomized and the resulting mist transferred into the reactor using a flow of carrier gas as described in Example 1. However, no evidence of film formation was detected on the sapphire substrate. This result indicates the importance of forming a solution of the precursor.

EXAMPLE 2

Deposition of Epitaxial Films of Lithium Niobate from LiNb(OC$_2$H$_5$)$_6$

LiNb(OC$_2$H$_5$)$_6$ was prepared as in Comparative Example 1. A 0.01 molar solution of LiNb(OC$_2$H$_5$)$_6$ in toluene was prepared under argon and stirred at room temperature until all of the solid had dissolved (about 48 hours), giving a clear, colorless solution. This solution was then transferred to the ultrasonic atomizer and the lithium niobate film was prepared using the procedure as described in Example 1 except that the low temperature zone of reactor 8 was about 280° C. and the temperature of the high temperature zone was about 463° C. An (0001) sapphire substrate was located in the high temperature zone. After deposition for thirty minutes the sample was cooled to room temperature. Using this process, an optically transparent lithium niobate (LiNbO$_3$) film was deposited on the (0001) sapphire substrate. X-ray diffraction analyses indicated that only a single phase of stoichiometric LiNbO$_3$ was present and that the film had grown in an epitaxial relationship to the substrate. The epitaxial nature of the lithium niobate film was confirmed by a rocking curve measurement which had a full width at half maximum of 0.38 2θ°. Elemental analysis of the film by inductively coupled plasma spectroscopy (ICP), indicated that the film contained the desired one to one lithium to niobium ratio within experimental error (+/− 2 percent).

EXAMPLE 3

Deposition of Epitaxial Films of Lithium Tantalate on a Lithium Niobate Substrate Using LiTa(OC$_2$H$_5$)$_6$ as a Precursor LiTa(OC$_2$H$_5$)$_6$ was prepared using a technique similar to Comparative Example 1 and Example 2 above but using Ta(OC$_2$H$_5$)$_5$ rather than Nb(OC$_2$H$_5$)$_5$. A 0.01 molar solution of LiTa(OC$_2$H$_5$)$_6$ in toluene was prepared under argon, and stirred until all the solid had dissolved giving a clear, colorless solution. The solution was then transferred to the ultrasonic atomizer and a lithium tantalate (LiTaO$_3$) film was deposited using the procedure described in Example 1 except that the low temperature zone of reactor 8 was about 280° C., while the high temperature zone was about at 551° C. A lithium niobate substrate was located in the high temperature zone. After deposition for thirty minutes, an optically transparent crystalline lithium tantalate film, approximately 0.3 μm thick, was deposited on the lithium niobate substrate. X-ray diffraction analyses indicated that only an epitaxial single phase of stoichiometric LiTaO$_3$ was present.

The invention has been described in detail with particular reference to preferred embodiments thereof, but it will be understood that variations and modifications can be effected within the spirit and scope of the invention.

We claim:

1. A method for depositing a complex metal oxide film on a substrate, which comprises:
   vaporizing a liquid single source precursor solution comprising a solution of a single organometallic compound having the general formula

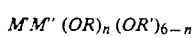

$MM'(OR)_n(OR')_{6-n}$ wherein one of either M' or M" is Li, Na, K, Mg, Ca, Sr, Ba, or Pb, and the other of either M' or M" is V, Nb, Ta, Ti, Zr, or Hf, R and R' are alkyl or aryl, and n is from 0 to 6; and contacting said substrate with the vapor of said single source precursor prior to substantial disporportionation of said precursor at a temperature sufficient to deposit a complex metal oxide film containing M' and M" on said substrate.

2. A method according to claim 1, wherein said alkyl groups are ethyl, methyl, n-propyl, i-propyl, n-butyl, or t-butyl.

3. A method for depositing a complex metal oxide film on a substrate, which comprises:

vaporizing a single source precursor comprising a single organometallic compound having the general formula:

$$M'M''(OR)_n(OR')_{6-n}$$

wherein one of either M' or M" is Li, Na, K, Mg, Ca, Sr, Ba, or Pb, and the other of either M' or M" is V, Nb, Ta, Ti, Zr, or Hf, R and R' are alkyl or aryl, and n is from 0 to 6; and vaporizing said single source precursor by direct heating of said precursor; and contacting said substrate with the vapor of said single source precursor prior to substantial disproportionation of said precursor at a temperature sufficient to deposit a complex metal oxide film containing M' and M" on said substrate.

* * * * *